AUTOMATICALLY TUNED COMMUNICATIONS SYSTEMS

Filed Nov. 14, 1966 2 Sheets-Sheet 1

INVENTORS
RAYMOND R. SEPPLER
ROBERT P. FRUEHSAMER

BY M. [signature] ATTY

78

INVENTORS
RAYMOND R. SEPPLER
ROBERT P. FRUEHSAMER
BY M. L. Kadue ATTY

United States Patent Office 3,496,473

Patented Feb. 17, 1970

3,496,473

AUTOMATICALLY TUNED COMMUNICATIONS SYSTEMS

Raymond R. Seppeler, Webster, and Robert P. Fruehsamer, Rochester, N.Y., assignors to General Dynamics Corporation, a corporation of Delaware

Filed Nov. 14, 1966, Ser. No. 594,098

Int. Cl. H04b *1/06*

U.S. Cl. 325—346 12 Claims

ABSTRACT OF THE DISCLOSURE

Communications apparatus having electronic tuned circuits wherein control signals for tuning are obtained by means of a phase locked-loop including coarse tuning circuits and fine tuning circuits. The coarse tuning circuits generate the control signals by means of a clock which counts at a rate determined by the frequency of the error voltage generated in the loop for developing a staircase tuning waveform. The coarse tuning circuits are also operative to control band switching operations.

The present invention relates to communications systems and particularly to systems for automatically tuning radio and like apparatus.

The invention is especially suitable for use in radio apparatus having electronically tuned circuits wherein it is desired to tune to a desired frequency as dictated by the frequency of a reference signal.

Heretofore, tuning of radio apparatus has been accomplished by synchronizing a variable frequency oscillator with a reference frequency through the use of a phase locked-loop. Amplifier circuits in the radio were also tuned by means of a control voltage generated in the phase lock-loop. Such radio apparatus is described, for example, in U.S. Patent No. 3,249,876 issued Apr. 3, 1966 to J. Harrison. Such tuning of the radio apparatus has not been entirely automatic and has required the aid of mechanically or manually operative devices, such as turrets for switching in different tuned circuit elements. Tuning elements used in variable frequency oscillators and tuned amplifiers (e.g. voltage variable capacitors) are limited in tuning range. In other words, a tuned circuit containing available voltage variable capacitors may only be tuned over a limited band of frequencies. The band of frequencies over which such tuned circuits are operative is also a function of the cost of the voltage variable capacitors used therein. Accordingly, it is desirable that an automatically tuned radio be capable of operating in different bands in order to cover a wide range of frequencies without the need, of course, for mechanical band switching means. The need for mechanical or electro-mechanically operative switches, manually operative components or complex switching logic to change bands, has imposed serious drawbacks on automatically tuned radio apparatus.

It is an object of the present invention to provide improved communication apparatus which is automatically tunable over a wide range of frequencies.

It is another object of the present invention to provide an improved system for automatically tuning circuits to a frequency which is determined by the frequency of a reference signal.

It is still another object of the present invention to provide an improved automatic tuning system for radio and like apparatus which is automatically and electronically tunable without the need for mechanical switching or manually controlled devices.

It is still another object of the present invention to provide an automatic tuning system and mixer injection signal generating system for radio and like apparatus which has high tolerance to internal drift producing effects.

It is still another object of the present invention to provide an improved automatic tuning system which is capable of tuning radio and like apparatus to a frequency dictated by a frequency of reference signals and which is tolerant of distortion in such reference signals.

It is still another object of the present invention to provide improved apparatus for generating signals for mixer injection to obtain frequency translation to a constant intermediate frequency in response to reference signals of different frequency which generates, automatically, a signal of greater purity than such reference signals.

Briefly described, an automatic tuning system embodying the invention is adapted to operate with a radio apparatus having tuned circuits, say in the radio frequency amplifiers thereof, and which contains voltage controlled tuning elements such as voltage variable capacitors. These circuits can be arranged in different channels, each channel being provided for a different frequency band. Electronically operated switching means are connected to the channels for selecting the desired band. A variable frequency oscillator is provided for generating mixer injection signals, in the event that the radio apparatus is of the superheterodyne type. Separate variable frequency oscillators may be provided for each band and may be selected by electronic switching means. The variable frequency oscillator is contained in a phase locked-loop together with a phase detector and a pair of generators which supply coarse and fine tuning voltages. These voltages are together applied to tuned circuits in the variable frequency oscillators and in the amplifiers for controlling the frequency thereof. The radio system is tuned by the reference signal which is applied as an input to the phase detector in the loop. The phase detector produces an error signal which is applied to the fine and coarse tuning voltage generators. The coarse tuning voltage generator includes a circuit for generating a staircase voltage which increases in magnitude at a rate which depends upon the difference in frequency between the reference signal frequency and the variable frequency oscillator output frequency. When the variable frequency oscillator output and the reference signal are substantially synchronized, the fine tuning voltage generator provides a tuning voltage which is a function of the varying difference in phase between these signals and locks the variable frequency oscillator to the reference signal. The coarse tuning voltage generator includes a variable frequency clock, specifically a counter, which counts at a rate determined by the component of the phase detector error voltage which is a function of the difference in frequency between the variable frequency oscillator output and the reference signal. This counter controls the generation of a tuning voltage of staircase waveform. When the counter reaches a predetermined count, it initiates a control voltage which is indicative of the reference signal being out of the tuning range of the tuned circuits in the band which is in use. This control voltage operates the band switching means to select the next band and the coarse tuning process is repeated. In this manner the tuning capability of the system is searched until the circuits are tuned to the frequency dictated by the reference signal. Inasmuch as the search is accomplished electronically, the time to change frequency bands is minimized and manual control is eliminated.

Since an increasing (staircase) voltage is used to perform the coarse tuning, the operation of the circuit is nearly unaffected by temperature, aging, etc. If an out-of-lock conditions occurs, the circuit merely recycles to a new coarse tune voltage position and relocks.

The invention itself, both as to its organization and method of operation, as well as additional objects and advantages thereof will become more readily apparent from a reading of the following description in connection with the accompanying drawings in which.

Figures 1, 2:
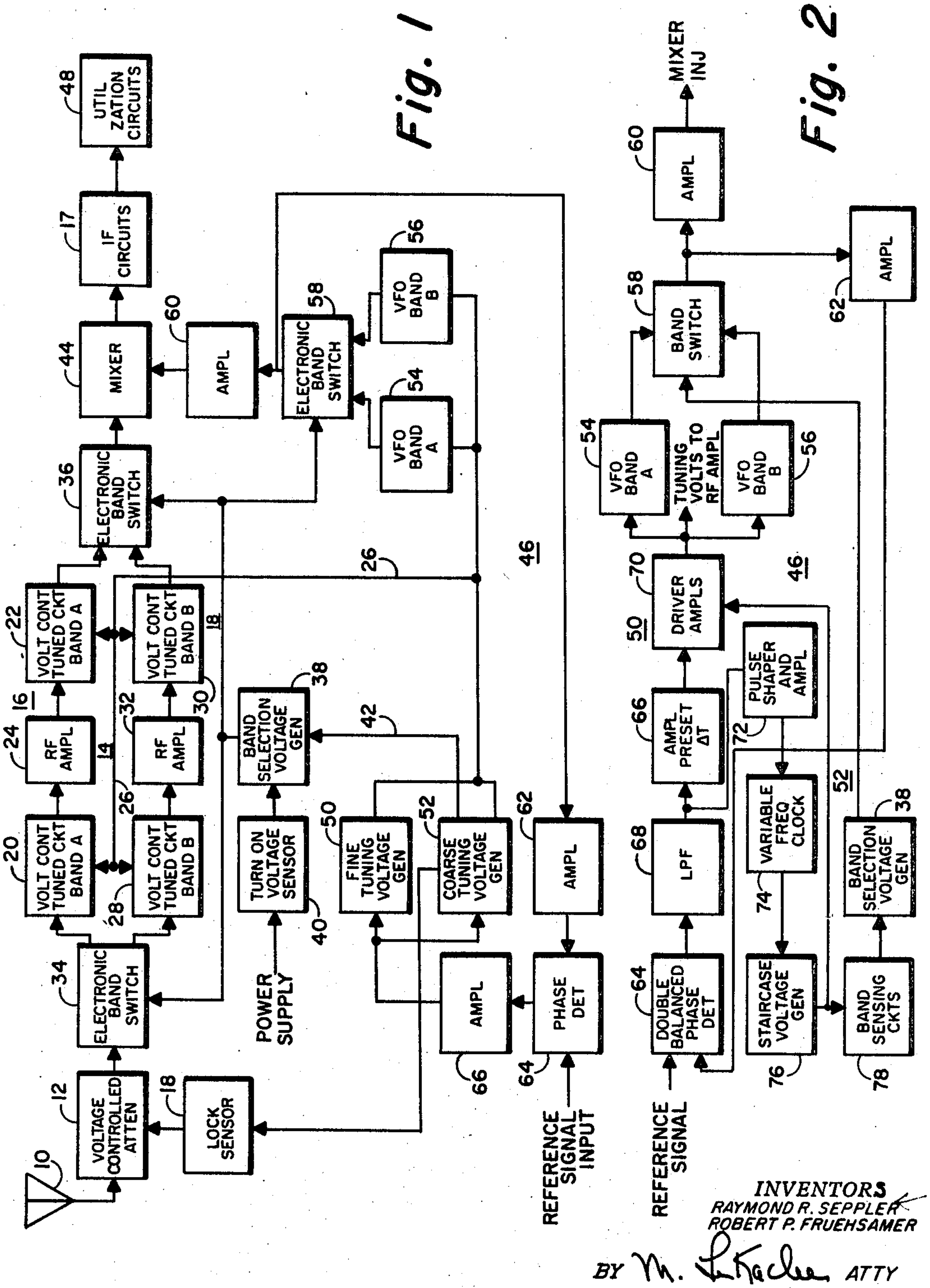
FIG. 1 is a block diagram of a receiver employing an automatic tuning system in accordance with the invention.
FIG. 2 is a more detailed block diagram of the automatic tuning system shown in FIG. 1.

Referring to FIG. 1, there is shown a receiver which is connected to an antenna 10. The RF signals which are picked up by the antenna are transmitted through a voltage controlled attenuator circuit 12 to radio frequency amplifier circuits 14. The voltage controlled attenuator may, for example, be a diode attentuator or a transistor attenuator which interposes an insertion loss depending upon the magnitude of a control voltage applied thereto. This control voltage may be derived from the intermediate frequency circuits 17 of the receiver by automatic gain control circuits. Inasmuch as such circuits may be designed in accordance with known techniques, they and their connection to the voltage controlled attenuator 12 are not shown, in order to simplify the illustration. In addition, the voltage controlled attenuator receives a signal from lock sensor circuit 18 which effectively squelches the input to the receiver from the antenna 10 until the receiver is tuned to the desired frequency.

The RF amplifier 14 is illustrated as having two channels 16 and 18 which are respectively allocated to different ones of two frequency bands, namely, band A and band B. While only two channels are illustrated, it will be appreciated that the amplifier may have a larger number of channels, each allocated to a successive frequency band. In other words, band A may extend from 2 mc./s. to 3 mc./s. Band B may extend from 3 mc./s. to 4 mc./s., and so forth. The bandwidth of the various bands is determined by the choice of voltage variable capacitors used and the maximum and minimum frequencies in each band $f$ max./$f$ min. may have a fixed ratio. The channel 16 includes a pair of voltage controlled tuned circuits 20 and 22, both tuned to band A, which are connected on opposite sides of a radio frequency amplifier 24. The voltage controlled tuned circuits may be double tuned circuits containing a pair of coils and a pair of capacitors. The capacitors are voltage variable capacitors. By varying the tuning voltage applied to these capacitors over a tuning voltage buss 26, the circuit may be tuned continuously over the entire band A. The radio frequency amplifier 24 may be a single or multiple transistor amplifier which is tuned to the frequency to be received by means of the circuits 20 and 22. Additional stages of radio frequency amplification similar to the amplifier 24 may be provided in the channel 16.

The other channel 18 of the RF amplifier also contains a pair of voltage controlled tuned circuits 28 and 30. These circuits, however, are tuned to band B and may be tuned across band B by the tuning voltage which is applied to the buss 26. An RF amplifier 32, similar to the amplifier 24 is also connected between the tuned circuits 28 and 30.

The channels are selected by electronic band switches 34 and 36 which are connected to the input and output terminals thereof. These band switches may be diode switches of the type to be described hereinafter in connection with FIG. 4. In the event that more than two channels are utilized, a plurality of gate circuits may be employed for electronic band switching purposes. A band switching signal, which may be a voltage level, is generated by a band selection voltage generator circuit 38, such as a transistor amplifier which has different output levels when in conductive and non-conductive states. A turn-on voltage sensor 40, such as a resistance-capacitance circuit, may be connected to the power supply. Thus, when the power supply is connected to the receiver (viz, when the receiver is turned on), a signal is applied to the generator 38 causing it to saturate in one state, thereby providing a voltage level, say a positive polarity $+V_1$ to the band switches 34 and 26, and thereby initially selecting the first band, band A, by connecting channel 16 to the remainder of the receiver.

The band selection voltage generator 38 also receives a control voltage along buss 42 which causes it to switch to the opposite state, thereby providing a different voltage level, say of negative polarity $-V_2$, to the band switches 34 and 36 so that the other channel 18 is selected. Then, the receiver may be tuned through band B. In the event that additional channels tuned to other successive bands are used, the band selection voltage generator may include a counter which is stepped through its counting cycle by successive pulses which appear on the line 42. The counter will translate its count into a code which will operate gating logic in the band switches 34 and 36 to select successive bands in the amplifier 14. The turn-on voltage sensor may, for example, be connected to the reset terminal of the counter so that when the receiver is turned on, the band A channel is connected initially.

The RF amplifier 14 output is applied through the output band switch 36 to a mixer 44. The mixer also receives an injection signal from a phase locked-loop 46. The phase locked-loop is automatically tuned to the proper frequency for the signal to be received. This tuning is accomplished automatically, as will be described in detail hereinafter. The received signal is translated in frequency to the desired intermediate frequency which is selected by the intermediate frequency circuit 17. The latter circuits are connected to utilization circuits 48 which may, for example, include demodulation circuits of various types (viz AM, FM, PM, FSK, and the like). Of course, if single sideband signals are received, requisite filtering may be included in mode selection circuits (not shown) which cooperate with the IF circuits.

The phase locked-loop 46 is operative to provide tuning voltages for tuning the receiver. Thus, tuning voltages are generated in a fine tuning voltage generator 50 and in a coarse tuning voltage generator 52, both of which are connected in the phase locked-loop. The phase locked-loop also contains variable frequency oscillators 54 and 56 for band A and band B, respectively. These oscillators may be tuned through their respective bands by the tuning voltages which are generated in the fine and coarse tuning voltage generators 50 and 52 and applied thereto. The buss 26 is connected to the output of the tuning generators 50 and 52 and applies the tuning voltage to the voltage controlled tuned circuits 20, 22, 28 and 30 in the RF amplifier 14. Only one of the VFO's 54 and 56 is connected in the loop 46 at any one time by means of an electronic band switch 58. The switch 58 may be similar to the switches 34 and 36. In the event that additional bands are utilized, additional VFO's corresponding thereto, which can be tuned through each of such bands, may be provided. The desired VFO and the desired RF amplifier channel are conjointly selected by control voltages applied to the switches 34, 36, and 58 by the band selection voltage generator 38.

The selected VFO provides the mixer selection signal which is applied to the mixer 44 by way of a buffer amplifier 60.

The selected VFO output is also circulated around the phase locked-loop through another amplifier 62. The loop is closed through a phase detector 64, the output of which is connected to the tuning voltage generators 50 and 52 through another buffer amplifier 66.

The receiver is tuned by means of a reference signal which may be obtained from a frequency synthesizer and is applied to an input of the phase detector 64. This reference signal may be of any frequency within the band over which the receiver is operative. The reference signal should, however, be offset from the frequency to which the receiver is to be tuned by the IF frequency, in accordance with superheterodyne techniques. The coarse tuning voltage generator responds to outputs of the phase detector which indicates that the reference signal is outside of the capture range of the phase locked-loop. It produces a tuning voltage which varies in amplitude in accordance with the difference in frequency between the reference signal frequency and the selected VFO output frequency. In the event that in the maximum value of the coarse tuning voltage does not bring the selected VFO within the locking range of the loop, the coarse tuning control generator produces a control signal along line 42 which operates the band selection voltage generator and effectuates a band switching operation. The coarse tuning voltage then again increases in amplitude (viz recycles) until the reference signal is within the capture range of the loop. At that time, the fine tuning voltage generator produces a fine (varying DC) tuning voltage which brings the loop into locked condition. Simultaneously, the RF amplifier is tuned to the desired frequency. When the receiver is locked, the coarse tuning voltage generator operates the lock sensor circuit 18 to permit the received signal to enter the receiver. Inasmuch as the phase locked-loop is an effective filtering device, it is tolerant of distortion of the reference signal, and does not lock to spurious frequency components of the reference signal. Moreover, the phase locked-loop continuously adjusts, say in the presence of drift due to temperature effects and the like, so that the receiver remains tuned to receive the desired frequency.

The phase locked-loop 46 is shown in greater detail in FIG. 2. The phase detector 64 is desirably a double balanced phase detector; i.e., both the reference signal and the VFO output signals are balanced out in the circuit, and only the modulation products $(f_r+f_v)$ and $(f_r-f_v)$ appear, where $f_r$ is the reference frequency and $f_v$ is the VFO frequency. The low pass filter 68 passes only the difference frequency $(f_r-f_v)$ and applies it to an amplifier 66. The amplifier 66 is desirably an operational amplifier having the proper feedback connected between its output and its input to provide a preset time constant $\Delta_T$ which provides filtering action in the loop, thereby preventing high frequency transients from interfering with proper loop operation. In the event that the VFO output which is applied to the phase detector 64 is outside of the locking range of the loop, say where the difference frequency is more than a few cycles per second, an alternating current signal passes through the filter 68 and is applied to the circuits of the coarse tuning generator 52. This latter signal may be referred to as an error signal. The error signal is, of course, a slowly varying DC voltage when the difference frequency is within a few cycles. This DC voltage is generated as the fine tuning voltage and is passed through amplifier 66 and driver amplifier 70 which are wide band amplifiers also capable of passing DC signals. Thus, the circuitry from the output of the phase detector 64 through the driver amplifiers 70 provides the fine tuning voltage generator 50. The driver amplifiers 70 also combine the output of the coarse tuning voltage generator 52 with the fine tuning voltage and apply them together to the VFO's 54 and 56 as well as to the buss 26. The VFO's 54 and 56 will be described in greater detail in connection with FIG. 4. Briefly, they contain voltage variable capacitors, the capacitance presented by which is varied in accordance with the amplitude of the tuning voltage. The tuning voltage may vary by as much as 100 volts in the illustrated system. As mentioned above, however, the number of bands utilized depends upon the tuning range of the voltage variable capacitors. This tuning range generally depends upon the voltage which these capacitors are capable of handling, at least as regards voltage variable capacitors which are presently available. Thus, the number of bands and the range of tuning voltage amplitude are related to each other. The system admits the use of many bands, and thus permits the use of low cost available voltage variable capacitors.

The error voltage is applied to a pulse shaper and amplifier circuit 72 in the coarse tuning voltage generator 52. This circuit may, for example, include an amplifier stage, a differentiator circuit, a threshold detector connected in the order stated, which in effect, constitutes a positive cross-over detector and provides a pulse for each cycle of the difference frequency component of the error voltage. In order to prevent introduction of any unwanted signals, a level sensing circuit, which reverse biases a diode switch to inhibit the amplifier when signals are below a certain level, may be used. These pulses are applied to a variable frequency clock circuit 74. This circuit may be a flip-flop which is synchronized by the pulses but which cannot provide output pulses at a rate which exceeds a certain rate consistent with the locking speed of the loop and the counting capacity of a counter in the staircase voltage generator 76 to which the output of the clock is connected. The last mentioned counter may be a binary counter having a plurality of successive flip-flops which enables the connection of a voltage source to a ladder network in accordance with the count stored therein. The ladder network produces a staircase voltage which is amplified to the desired level by means of the driver amplifiers 70. As the difference frequency component of the error voltage becomes smaller, the duration or width of the steps in the staircase increases. Accordingly, the tuning voltage permits the selected variable frequency oscillator, either 54 or 56, to approach the reference frequency at a decreasing rate. This feature effectively reduces the inertia in the coarse tuning circuits and precludes "overshoot." Thus, the phase locked-loop gradually approaches its locking range and readily locks to the desired frequency.

The capacity of the counter is, however, limited to a count which will result in a voltage which tunes the selected VFO to a frequency near the upper end of its band. This frequency desirably overlaps the frequency at the lower end of the next band. In other words, band A may end at 3 mc./s. and band B may start at 2.7 mc./s. When the maximum count is reached, which in the illustrated case is 8,192, the counter applies a pulse to the band sensing circuits 78. These circuits, in turn, apply a control voltage to the band selection voltage generator 38 which effects a band switching operation. Once the next band is selected, another cycle of staircase voltage is produced which should bring the phase locked-loop 46 into lock with the reference signal. In the event that only two bands are used (viz. band A and band B, as illustrated), the reference signal should lie within those bands. Additional bands may be provided, as mentioned above.

Figure 3:
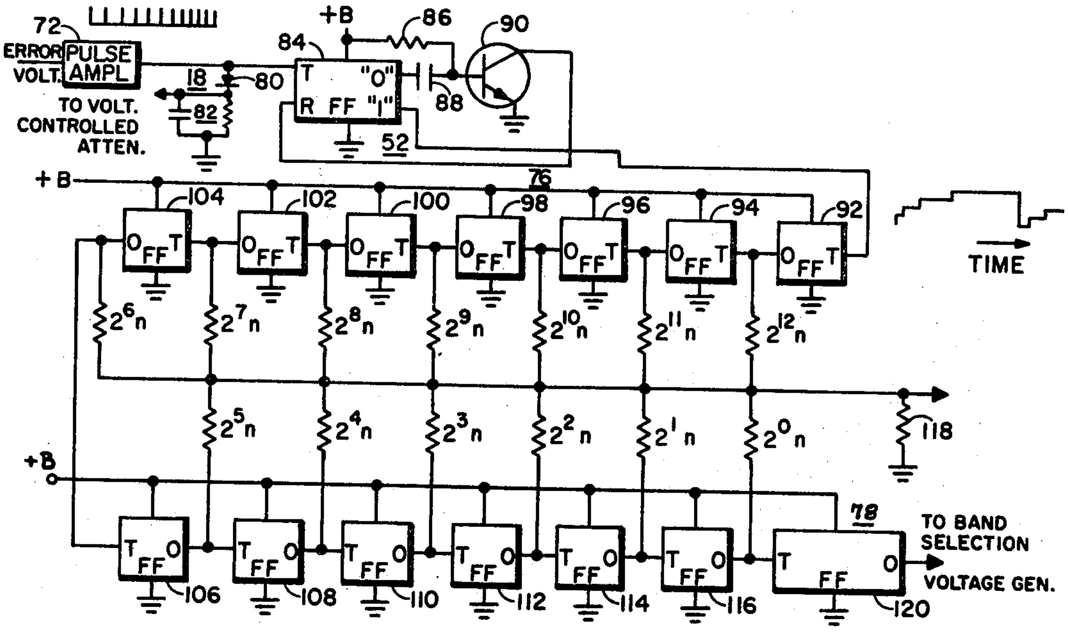
FIG. 3 is a schematic diagram of the coarse tuning voltage generator which is shown in FIGS. 1 and 2.

The coarse tuning voltage generator 52 is illustrated in greater detail in FIG. 3. The error voltage is applied to the pulse amplifier which provides a train of pulses of varying frequency in the event that $(f_r-f_v)$, the difference frequency component, exists. This train of pulses is applied at the lock sensor circuit 18 which is a peak detector circuit containing a diode 80 and an RC filter 82. This circuit may be connected to a DC amplifier and thence to the voltage controlled attenuator 12 (FIG. 1) so as to squelch the input signal to the receiver before the receiver is tuned. Of course, when the receiver is tuned, the difference frequency component disappears and the squelch voltage generated by the circuit 18 is not effective.

The pulse train is applied to the variable frequency clock 74 which contains a triggerable flip-flop 84. Only the "0" output (viz. the output which is at B+ potential when the flip-flop is reset and at ground potential when the flip-flop is set), is used. This output is referred to in integrated circuit flip-flops 84 which may be used in practicing the illustrated embodiment of the invention as the "$\overline{Q}$" output. Such flip-flops are sold by Texas Instrument Company, Dallas, Tex., their type SN7470. The "$\overline{Q}$" output is connected to a charging circuit including a resistor 86 and a capacitor 88. The base of a transistor 90 is connected to the junction of this resistor and capacitor. The collector of this transistor is connected to the reset terminal of the flip-flop 84. The charging circuit and the transistor conditions as the flip-flops so that it may not exceed a certain maximum switching rate, say 200 kc./s., and will produce an output pulse rate within the counting rate capability of the staircase generator 76, as well as the dynamic response range of the phase locked-loop. This frequency limitation results since the capacitor will not charge to a sufficient voltage to trigger the transistor and therefore inhibits the flip-flop switching rate if it exceeds 200 kc. In other words, if the flip-flop switching rate is below 200 kc., the capacitor 88 can charge sufficiently through the flip-flop to reach a charge sufficient to trigger the transistor 90. This grounds the reset terminal allowing proper flip-flop action. However, if the flip-flop switching rate is high, the capacitor 88 does not have sufficient time to charge and the transistor 90 will not be triggered. The "$\overline{Q}$" output of 84 is applied to the counter 76, and since the flip-flop is a "divide by 2" device, pulses at a 100 kc. rate will be applied to the counter 76. The counter is a binary counter made up of thirteen flip-flop stages, 92, 94, 96, 98, 100, 102, 104, 106, 108, 110, 112, 114 and 116. This flip-flops may be Signetics, Incorporated of Sunnyvale, Calif, type SU320. These stages are connected in tandem, with the "$\overline{Q}$" or "0" output of the preceding stage connected to the trigger input of the succeeding stage. The counter cooperates with a ladder network made up of thirteen resistors and a load resistor 118. The thirteen resistors are indicated by the legends $2^0n$ to $2^{12}n$. Alternate pulses applied to the trigger input of each flip-flop will effectively connect its "$\overline{Q}$" output to the voltage source at +B. This voltage source will hen effectively be connected to the resistor of the ladder network connected to the flip-flop "$\overline{Q}$" output. The ladder network resistors and the load resistor 18 constitute a voltage divider with the output voltage thereof taken across the output resistor 118. Accordingly, as the pulses are applied to the input of the first flip-flop 92 (the trigger inputs responding in the case of these flip-flops only to the negative going portion of the pulse), a successive step of the staircase voltage will appear across the output resistor 118. The duration of each step will depend upon the triggering pulse rate. Accordingly, as the triggering pulse rate decreases with a decreasing difference frequency component of the error voltage, the steps of the staircase will become wider. This permits the phase locked-loop to slowly approach locked condition. In other words, the condition where the fine tuning voltage can lock the loop is reached at a decreasing rate. This permits "capture" of the loop by the reference voltage without "overshoot" and more rapid acquisition of the reference signal.

When the maximum count is reached (viz. 8,192), the last flip-flop 116 produces an output pulse which triggers a flip-flop 120. The flip-flop 120 provides the band sensing circuit 78 and produces an output voltage level of either $+V_s$ or 0 which is applied to the band selection voltage generator. When this voltage is positive (viz. when the flip-flop 120 is set, the receiver is conditioned to operate in band A, however, when the flip-flop "$\overline{Q}$" output is $+V_s$, the receiver is conditioned to operate in band B), the effectiveness of the opposite polarity switching voltages generated in the band selection voltage generator in selecting the different bands will be more apparent from FIG. 4 where it is shown how a diode electronic band switch responds to such opposite polarity levels to select either band A or band B. When the second band, say band B is selected, the counter starts a new cycle and will produce a staircase voltage which will tune the receiver to a frequency within band B.

Figure 4:
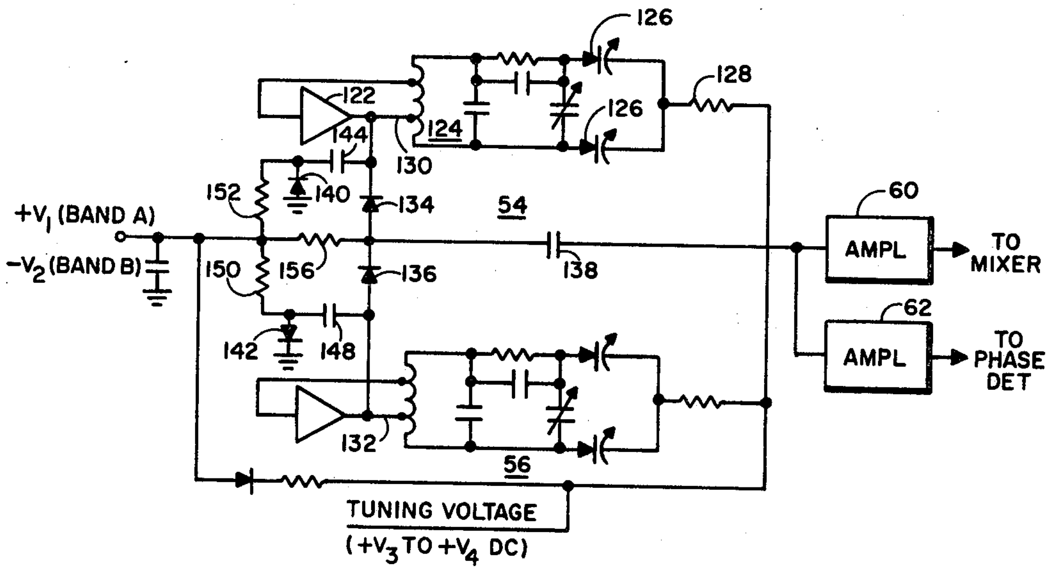
FIG. 4 is a schematic diagram of the variable frequency oscillators and their associated band switch; the oscillator and switch also being shown in FIG. 2.

The band A and band B variable frequency oscillators 54 and 56 are shown in FIG. 4. The band A oscillator 54 includes an amplifier 122 which is connected in Hartley configuration with a tuned circuit 124. The tuned circuit also includes a pair of voltage variable capacitor diodes 126 to which the tuning voltage is applied by way of a resistor 128. The band B variable frequency oscillator is identical excepting, of course, the inductor in its tank circuit is of a different value of inductance than the inductor 124 of the band A oscillator 54 so that the band B oscillator may operate over the higher frequency band. The output taps 130 and 132 of the oscillators 54 and 56 are connected through diodes 134 and 136 and through a capacitor 138 to the oscillator output which in turn is connected to the input of the amplifiers 60 and 62 which feed the mixer and the phase detector.

The diodes 134 and 136 and the circuit components connected thereto provide the electronic band switch 58. These circuit components are another pair of diodes 140 and 142, which are oppositely polarized and connected to ground and to coupling capacitors 144 and 148 and DC path completing resistors 150, 152 and 156.

When the band A selection voltage indicated as $+V_1$ is applied to the switch 58 from the band selection voltage generator, the diode 142 is biased into its conducting condition as is the diode 134. Whereas, the diodes 140 and 136 are reversed biased. Accordingly, the band B oscillator 56 output is shunted to ground through the capacitor 148 and diode 142, while the band A oscillator output is applied to the output line by way of the forward bias diode 134. Similarly, when the band B selection voltage $-V_2$ is applied to the diodes, the diodes 136 and 140 are forward biased, while the diodes 134 and 142 are reversed biased. Accordingly, only the output of the band B VFO 56 is applied to the output line. Similar diode electronic switches may be used to provide the requisite connections in the band switches 34 and 36 (FIG. 1).

From the foregoing description, it will be apparent that there has been provided improved automatic tuning apparatus which is used in a receiver. It will be appreciated, of course, that the apparatus described is also suitable for use in television and other radio apparatus, including exciters, transmitters, and the like. Variations and modifications in the herein described apparatus will, undoubtedly, suggest themselves to those skilled in the art. It should also be noted that the abstract of disclosure paragraph is appended hereto solely for purposes of formal compliance with Rule 72(*b*) of the Rules of Practice which appeared initially in 31 Fed. Reg. 12922.

What is claimed is:

1. Apparatus for tuning, to selected signal frequencies with the aid of a reference signal of constant frequencies related to said selected frequencies, a communication system having a signal path to an antenna, said apparatus comprising (a) a phase locked loop separate from said signal path including
  (i) a variable frequency oscillator having a variably tuned circuit,
  (ii) a phase detector responsive to the output of said oscillator and said reference signal,
  (iii) means for generating a tuning voltage which varies in amplitude at a rate determined by the magnitude of the difference in frequency between said reference signal frequency and said variable frequency oscillator output frequency, and (b) means for applying the output of said last-named means to said variable frequency oscillator tuned circuit for controlling the tuning of said oscillator.

2. The invention as set forth in claim 1 wherein said apparatus includes a plurality of tuned circuits each operative over a different frequency band and means responsive to a predetermined magnitude of said output voltage for switching between said plurality of tuned circuits.

3. The invention as set forth in claim 1 wherein said tuning voltage generating means comprises a counter which advances one count for each cycle of said difference in frequency, impedance means connected to the stages of said counter for deriving an output voltage which varies stepwise in accordance with the count stored in said counter for producing a staircase voltage, said staircase voltage providing the output of said tuning voltage generating means.

4. The invention as set forth in claim 3 including a bi-stable stage connected to the output of the last stage of said counter for providing output levels of different value during different ones of successive counting cycles executed by said counter, and wherein said apparatus also includes a plurality of said variable tuned circuits and a plurality of said variable frequency oscillators for covering successive frequency bands, and switching means for selecting different ones of said oscillators and tuned circuits, and means responsive to said output level of said bi-stable stage for selecting different ones of said tuned circuits and oscillators.

5. A system for generating an output signal having a frequency selected with the aid of a reference signal which may have many different frequencies, said system comprising (a) means for producing said output signal with a frequency which depends upon a parameter of a control signal applied thereto, (b) means for comparing said reference signal with said output signal for producing an error signal which varies in frequency in accordance with the difference in frequency between the frequencies of said output signal and said reference signal, (c) means responsive to said error signal for generating, as said control signal, a signal having said parameter which varies stepwise in amplitude as a function of the frequency said error signal, and (d) means for applying said control signal to said output signal producing means whereby said output signal provides the signal to be generated by said system.

6. The invention as set forth in claim 5 further comprising a radio apparatus including amplifier circuits which operate at radio frequencies and intermediate frequencies respectively, said radio apparatus including frequency translating means connected between said radio and intermediate frequency circuits, and means for applying said output signal generated by said system as an injection signal to said frequency translating means.

7. The invention as set forth in claim 6 wherein said radio frequency circuits include tuned circuits having tuning elements, the reactance of which depends upon said parameter of said control signal, and means for applying said control signal to said elements for varying the tuning of said radio frequency amplifier circuits.

8. The invention as set forth in claim 5 wherein said comparing means is operative to produce in said error signal a component having said parameter which varies in accordance with the difference in phase between said reference and output signals, and means for applying said component together with said control signal to said output signal producing means.

9. The invention as set forth in claim 5 wherein the frequencies of said reference signal may be within several successive frequency bands, and wherein a number of output signal producing means are provided, each corresponding to a different one of said bands, and further wherein said control signal responsive means includes means for switching between successive ones of said signal producing means when said error signal attains a predetermined value.

10. The invention as set forth in claim 5 wherein said error signal responsive means includes means for cyclically producing said control signal having said parameter, which parameter increases stepwise corresponding with the increase in frequency of said error signal until it attains a predetermined value, and then decreases abruptly to constitute a cycle of said control signal.

11. The invention as set forth in claim 1 wherein said apparatus includes at least one additional voltage responsive variably tuned circuit in said signal path, and means for simultaneously applying said tuning voltage to said variable frequency oscillator tuned circuit and to said additional voltage responsive variable tuned circuit.

12. The invention as set forth in claim 5 wherein said control signal generating means also includes means for providing another control signal which varies in accordance with the difference in phase between said output signal and said reference signal, and means included in said control signal generating means for providing one or the other of the control signals depending upon the frequency of said error singal.

References Cited

UNITED STATES PATENTS

| | | | |
|---|---|---|---|
| 3,189,825 | 6/1965 | Lahti | 325—346 |
| 3,249,876 | 5/1966 | Harrison | 325—453 |
| 3,259,851 | 7/1966 | Brauer | 331—25 XR |
| 3,264,566 | 8/1966 | Kaufman | 325—462 XR |
| 3,344,361 | 9/1967 | Granquist | 331—25 XR |
| 3,371,281 | 2/1968 | Powell | 325—346 |

KATHLEEN H. CLAFFY, Primary Examiner

BARRY PAUL SMITH, Assistant Examiner

U.S. Cl. X.R.

325—421, 453; 331—18